(12) United States Patent
Kim

(10) Patent No.: US 12,034,084 B2
(45) Date of Patent: Jul. 9, 2024

(54) SEMICONDUCTOR DEVICE INCLUDING POLY-SILICON JUNCTION FIELD-EFFECT TRANSISTOR AND MANUFACTURING METHOD THEREOF

(71) Applicant: SK keyfoundry Inc., Cheongju-si (KR)

(72) Inventor: Young Bae Kim, Sejong-si (KR)

(73) Assignee: SK keyfoundry Inc., Cheongju-si (KR)

( * ) Notice: Subject to any disclaimer, the term of this patent is extended or adjusted under 35 U.S.C. 154(b) by 80 days.

(21) Appl. No.: 17/549,118

(22) Filed: Dec. 13, 2021

(65) Prior Publication Data

US 2022/0376118 A1 Nov. 24, 2022

(30) Foreign Application Priority Data

May 20, 2021 (KR) ........................ 10-2021-0064859

(51) Int. Cl.
*H01L 29/66* (2006.01)
*H01L 29/10* (2006.01)
*H01L 29/808* (2006.01)

(52) U.S. Cl.
CPC ...... *H01L 29/8086* (2013.01); *H01L 29/1033* (2013.01); *H01L 29/66901* (2013.01)

(58) Field of Classification Search
CPC ............. H01L 29/8086; H01L 29/1033; H01L 29/66901; H01L 21/761; H01L 29/1066; H01L 29/16; H01L 29/66765; H01L 29/78678; H01L 29/808
USPC ........................................................ 257/134
See application file for complete search history.

(56) References Cited

U.S. PATENT DOCUMENTS

| 4,143,392 | A | 3/1979 | Mylroie |
| 4,611,220 | A * | 9/1986 | MacIver ........... H01L 29/78696 257/260 |
| 7,518,189 | B1 * | 4/2009 | Hackler, Sr. ........ H01L 29/7832 257/134 |
| 7,709,311 | B1 * | 5/2010 | Saha ................. H01L 29/66901 257/E21.446 |
| 8,217,487 | B2 | 7/2012 | Choi et al. |
| 9,184,304 | B2 | 11/2015 | Kim et al. |
| 9,263,438 | B2 | 2/2016 | Kim et al. |
| 9,343,588 | B2 | 5/2016 | Werner |
| 2007/0284626 | A1 * | 12/2007 | Vora ...................... H03L 7/0812 257/256 |
| 2008/0001183 | A1 * | 1/2008 | Kapoor ............. H01L 29/66901 257/E21.336 |
| 2008/0272394 | A1 * | 11/2008 | Kapoor ............... H01L 29/1066 257/190 |

(Continued)

Primary Examiner — Sheikh Maruf
(74) Attorney, Agent, or Firm — NSIP Law

(57) ABSTRACT

A semiconductor device, includes an insulating film formed on a substrate; a conductive layer, comprising first and second doped poly-silicon regions and a undoped poly-Si region, formed on the insulating film; a highly doped first conductivity type drain region and a highly doped a first conductivity type source region formed in the first and second doped poly-silicon regions, respectively; and a highly doped second conductivity type gate region formed in the undoped poly-Si region between the highly doped first conductivity type drain region and the highly doped first conductivity type source region. The undoped poly-Si region is disposed closer to the highly doped first conductivity type source region than the highly doped first conductivity type drain region.

17 Claims, 17 Drawing Sheets

(56) References Cited

U.S. PATENT DOCUMENTS

| | | | | |
|---|---|---|---|---|
| 2008/0272395 A1* | 11/2008 | Banna | H01L 29/7843 | 257/256 |
| 2008/0272409 A1* | 11/2008 | Sonkusale | H01L 29/66901 | 257/287 |
| 2008/0315266 A1* | 12/2008 | Eshun | H01L 27/0617 | 257/E21.445 |
| 2009/0072278 A1* | 3/2009 | Kapoor | H01L 29/66901 | 257/256 |
| 2010/0019249 A1* | 1/2010 | Mouli | H01L 29/66848 | 257/280 |
| 2010/0019291 A1* | 1/2010 | Mouli | H01L 29/808 | 257/E21.445 |
| 2010/0148226 A1* | 6/2010 | Mouli | H01L 21/385 | 257/256 |
| 2010/0171154 A1* | 7/2010 | Saha | H01L 21/84 | 257/256 |
| 2012/0273871 A1* | 11/2012 | Yedinak | H01L 29/7813 | 257/329 |
| 2013/0001656 A1* | 1/2013 | El-Kareh | H01L 29/8086 | 257/E29.226 |
| 2013/0043532 A1* | 2/2013 | Disney | H01L 29/063 | 257/E29.256 |
| 2014/0110753 A1* | 4/2014 | Mouli | H01L 29/802 | 257/256 |
| 2014/0139282 A1* | 5/2014 | Yeh | H03K 17/223 | 257/285 |
| 2014/0246680 A1* | 9/2014 | Mouli | H01L 29/267 | 257/256 |
| 2015/0325694 A1* | 11/2015 | Chan | H01L 29/405 | 327/434 |
| 2016/0141418 A1* | 5/2016 | Yeh | H03K 17/223 | 257/285 |
| 2017/0077316 A1* | 3/2017 | Nidhi | H01L 29/808 | |
| 2017/0133505 A1* | 5/2017 | Han | H01L 29/408 | |
| 2019/0096874 A1* | 3/2019 | Rajagopal | H01L 27/0285 | |

* cited by examiner

SEMICONDUCTOR DEVICE INCLUDING POLY-SILICON JUNCTION FIELD-EFFECT TRANSISTOR AND MANUFACTURING METHOD THEREOF

CROSS-REFERENCE TO RELATED APPLICATION

This application claims the benefit under 35 U.S.C. § 119 of Korean Patent Application No. 10-2021-0064859 filed on May 20, 2021, in the Korean Intellectual Property Office, the entire disclosure of which is incorporated herein by reference for all purposes.

BACKGROUND

1. Field

The following description relates to a semiconductor device including poly-silicon junction field-effect transistor and manufacturing method thereof.

2. Description of Related Art

As one of semiconductor devices, a semiconductor device including junction field-effect transistor (JFET) is known.

However, in a traditional semiconductor device, including junction field-effect transistor, the size has to be enlarged to form a RESURF structure when a withstand voltage over hundreds of volt is needed. Additionally, when JFETs with a variety of withstand voltage are used, each JFET with a different structure is used and mixed, which may be a problem.

Accordingly, an extra procedure is added along with each structure of JFET, and the cost rises because of the increasing area. Also, a source, a drain and a gate region are formed through ion implantation with a high concentration in a Si-substrate, respectively. Therefore, when a voltage is applied in a drain region, a depletion is expanded, and a pinch-off voltage of JFET is not fixed but increased according to a bias.

And, when using it without knowing the phenomenon, JFET is not cut off because of pinch-off, which is changed according to a withstand voltage.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a semiconductor device, includes an insulating film formed on a substrate; a conductive layer, comprising first and second doped poly-silicon regions and a undoped poly-Si region, formed on the insulating film; a highly doped first conductivity type drain region and a highly doped a first conductivity type source region formed in the first and second doped poly-silicon regions; and a highly doped second conductivity type gate region formed in the undoped poly-Si region between the highly doped first conductivity type drain region and the highly doped first conductivity type source region. The undoped poly-Si region is disposed closer to the highly doped first conductivity type source region than the highly doped first conductivity type drain region.

The semiconductor device may further include a first conductivity type deep well region formed in the substrate to overlap the conductive layer. The first conductivity type deep well region may be in a floating state.

The insulating film may include a first oxide layer and a second oxide layer with different thicknesses.

An area of the undoped poly-Si region may be larger than an area of the highly doped second conductivity type gate region.

The highly doped second conductivity type gate region may extend to an upper surface of the insulating film.

The semiconductor device may be a poly-silicon junction field-effect transistor (poly-silicon JFET).

The poly-silicon JFET may include a plurality of the square-shaped conductive layer each spaced apart from another in parallel.

The highly doped second conductivity type gate region may be disposed closer to the highly doped first conductivity type source region than the highly doped first conductivity type drain region.

The semiconductor device may further include a silicide film formed on the highly doped second conductivity type gate region and the undoped poly-Si region, and a non-sal layer formed on the conductive layer.

In another general aspect, a manufacturing method of a semiconductor device, includes: forming an insulating film on a substrate; forming a conductive layer on the insulating film; dividing the conductive layer into a undoped poly-Si region and first and second doped poly-silicon regions; forming a highly doped first conductivity type drain region and source region in the first and second doped poly-silicon regions; forming a highly doped second conductivity type gate region in the undoped poly-Si region; and forming a plurality of contact plugs on the conductive layer.

The manufacturing method may further include forming a first conductivity type deep well region below the conductive layer in the substrate; and forming a second conductivity type deep well region in the substrate. The first conductivity type deep well region may adjoin the second conductivity type deep well region.

The forming of the insulating film may include forming a first oxide layer in the substrate, and forming a second oxide layer on the first oxide layer. A thickness of the first oxide layer and a thickness of the second oxide layer may be different from each other.

The undoped poly-Si region may adjoin the highly doped first conductivity type source region.

The manufacturing method may further include a silicide film formed on the highly doped second conductivity type gate region and the undoped poly-Si region, and a non-sal layer formed in the conductive layer.

In another general aspect, a semiconductor device, includes: an oxide layer disposed on a substrate; a conductive layer, comprising first and second doped poly-silicon regions and a undoped poly-Si region, disposed on the oxide layer; a highly doped first conductivity type drain region and a highly doped a first conductivity type source region disposed in the first and second doped poly-silicon regions; a highly doped second conductivity type gate region disposed in the undoped poly-Si region between the highly doped first conductivity type drain region and the highly doped first conductivity type source region; and a first non-sal layer disposed on the conductive layer over a portion of the highly doped first conductivity type drain region and a portion of the highly doped second conductivity type gate region.

The semiconductor device may further include a second non-sal layer disposed on the conductive layer over a portion of the undoped poly-Si region and another portion of the highly doped second conductivity type gate region.

The highly doped second conductivity type gate region may be disposed closer to the highly doped first conductivity type source region than the highly doped first conductivity type drain region.

The highly doped second conductivity type gate region may extend from an upper surface of the undoped poly-Si region to an upper surface of the oxide layer.

The semiconductor device may further include another oxide layer disposed between the oxide layer and the substrate.

The semiconductor device may be a poly-silicon junction field-effect transistor (poly-silicon JFET).

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
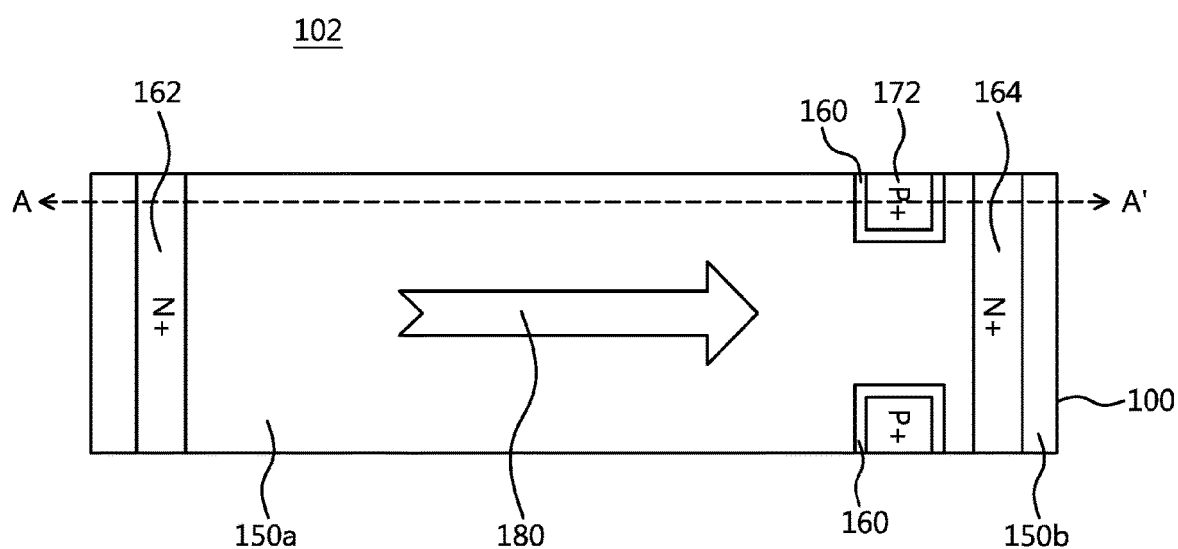
FIG. 1 illustrates a view of a semiconductor device, including a poly-silicon junction field-effect transistor, according to one or more embodiments of the disclosure.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," etc. may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include varies in shape that occur during manufacturing.

Herein, it is noted that use of the term "may" with respect to an example or embodiment, e.g., as to what an example or embodiment may include or implement, means that at least one example or embodiment exists where such a feature is included or implemented while all examples and embodiments are not limited thereto.

The features of the examples described herein may be combined in various ways, as will be apparent after an understanding of the disclosure of this application. Further, although the examples described herein have a variety of configurations, other configurations are possible, as will be apparent after an understanding of the disclosure of this application.

The disclosure is to solve above problems, providing a semiconductor device including poly-silicon junction field-effect transistor that may embody various withstand voltages, and providing a manufacturing method thereof.

A targeted problem of the disclosure is not limited by the problems which are mentioned above, and other problems may be understood by a person skilled in the relevant field of technology, from the following description.

A detailed description of the disclosure is given below, with attached drawings.

FIG. 1 illustrates a view of a semiconductor device, including a poly-silicon junction field-effect transistor according to one or more embodiments of the disclosure.

With reference to FIG. 1, a semiconductor device 102 including poly-silicon junction field-effect transistor may include a conductive layer 100 formed on a semiconductor substrate. A conductive layer 100 may be divided into first and second doped poly-silicon regions 150a and 150b, and undoped poly-Si regions 160. Undoped poly-Si regions 160 refer to a region in which ion implantation is not performed at all. On the other hand, first and second doped poly-silicon regions 150a and 150b refers to a region in which ion implantation with a predetermined concentration is performed. For example, first and second doped poly-silicon regions 150a and 150b may be doped as a first conductivity type with a low concentration. Although both first and second doped poly-silicon regions 150a and 150b and undoped poly-Si regions 160 have high resistance, the undoped poly-Si regions 160 may have higher resistance than the first and second doped poly-silicon regions 150a and 150b because it is not doped. A highly doped first conductivity type drain region (N+, 162) and a highly doped a highly doped a first conductivity type source region (N+, 164) are respectively disposed in the first and second doped poly-silicon regions 150a and 150b. Two highly doped second conductivity type gate regions (P+, 172) are disposed in the undoped poly-Si regions 160.

The highly doped first conductivity type drain and source regions 162 and 164 may be respectively located on almost opposite sides of a conductive layer 100. The highly doped first conductivity type drain and source regions 162 and 164 may have higher doping concentrations than those of the first and second doped poly-silicon regions 150a and 150b.

Moreover, in a top view, the two highly doped second conductivity type gate regions 172 may be placed on a top and a bottom in a conductive layer 100, with a certain distance from each other. A current path 180 may be formed through a gap between the two highly doped second conductivity type gate regions 172 that are formed to be spaced from each other. A pinch-off voltage may be controlled according to a distance between the two highly doped second conductivity type gate regions 172, which are separately formed. Also, the two highly doped second conductivity type gate regions 172 may be located between a highly doped first conductivity type drain region 162 and a highly doped a highly doped a first conductivity type source region 164. Two highly doped second conductivity type gate regions 172 may be respectively doped as a second conductivity type in a partial area of undoped poly-Si regions 160.

Because undoped poly-Si regions 160 are not doped, a resistance of a undoped poly-Si regions 160 may be greater over dozens to hundreds of times than a resistance of first and second doped poly-silicon regions 150a and 150b. Undoped poly-Si regions 160 may respectively surround two highly doped second conductivity type gate regions 172. By forming a undoped poly-Si regions 160 between the highly doped second conductivity type gate region 172 and the first and second doped poly-silicon regions 150a and 150b, a problem of JFET operation, where a pinch-off is not smoothly executed because of leakage, may be solved. That is, by forming undoped poly-Si regions 160, a leakage of a current flowing in a conductive layer 100 may be prevented. Undoped poly-Si regions 160 may be located closer to a highly doped a highly doped a first conductivity type source region 164 than a highly doped first conductivity type drain region 162.

In FIG. 1, a current may flow to a source region 164 through a high resistance conductive layer 100 when a bias is applied to a highly doped first conductivity type drain region 162. To cut or control an amount of a current, a reverse bias is applied to the two highly doped second conductivity type gate regions 172. Then, a depletion is started from the two highly doped second conductivity type gate regions 172, and when two depletions meet, a pinch-off occurs, making a current cut. The greater the distance between the two highly doped second conductivity type gate regions 172, the more a pinch-off voltage may rise.

According to the embodiment, in a semiconductor device 102 including poly-silicon junction field-effect transistor, a conductive layer 100 may have a similar structure with a poly-silicon resistance structure. Herein, the highly doped first conductivity type drain and source regions 162 and 164 may form a drain region and a source region, respectively, and a current may flow when a bias is applied. In addition, a highly doped second conductivity type gate region 172 may form a gate, forming between a source region and a drain region.

Since a conductive layer 100 has a structure similar to resistance, a voltage drop occurs as much as when a length is increased. If a high withstand voltage is needed, a length may be increased. Resistance may be decided according to a doping concentration of a conductive layer 100, and according to that, a voltage per length may be decided.

Meanwhile, a first conductivity type is shown as N-type, and a second conductivity type is shown as P-type, and according to that, an N-type poly-silicon JFET is embodied. However, it is clear for a person skilled in the relevant field of technology that there is no limitation about it. Thus, a P-type poly-silicon JFET may be embodied by reversely applying a doping type shown in each drawing. In this case, a drain and a source become P-type, and a gate becomes N-type.

The following description describes a case in detail when a first conductivity type is N-type, and a second conductivity type is P-type, but it may be possible that a first conductivity type is P-type, and a second conductivity type is N-type.

Figure 2A:
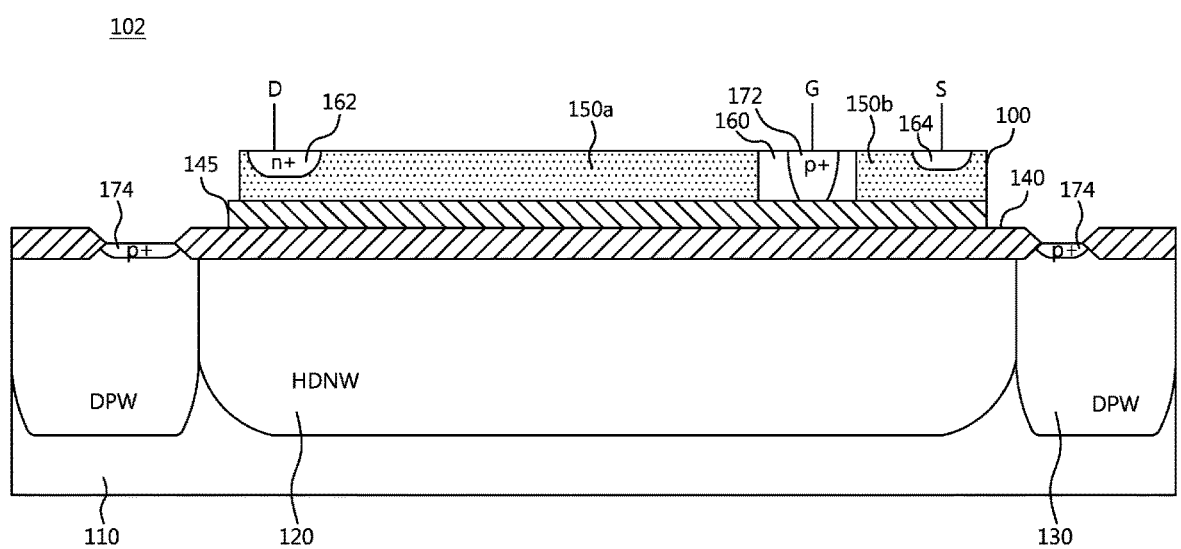
FIGS. 2A and 2B are cross-sectional views of a semiconductor device, including poly-silicon junction field-effect transistor according to A-A' of FIG. 1.
Figure 2B:
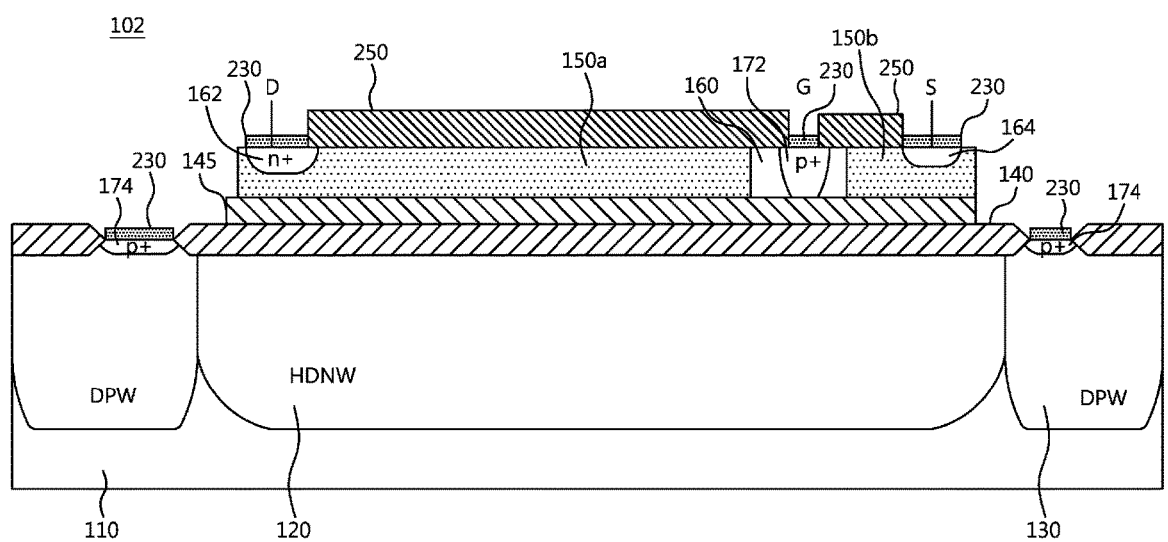

FIGS. 2A and 2B are cross-sectional views of a semiconductor device, including poly-silicon junction field-effect transistor according to A-A' of FIG. 1.

First, with reference to FIG. 2A, a semiconductor device 102 including poly-silicon junction field-effect transistor according to one or more embodiments of the disclosure may include a first conductivity type deep well region 120 and a second conductivity type deep well region (DPW) 130 formed in a substrate 110. A first oxide layer 140, a second oxide layer 145, and a conductive layer 100 may be included that are formed in order on the first conductivity type deep well region 120 and the second conductivity type deep well region 130. A first oxide layer 140 and a second oxide layer 145 may have different thicknesses. A conductive layer 100 may include first and second doped poly-silicon regions 150a and 150b and a undoped poly-Si region 160. The highly doped first conductivity type drain region 162 and the highly doped a first conductivity type source region 164 may be respectively formed in the first and second doped poly-silicon regions 150a and 150b. A highly doped second conductivity type gate region 172 may be formed in a undoped poly-Si region 160.

A highly doped second conductivity type gate region 172 may be doped to a bottom of a undoped poly-Si region 160 with a predetermined width. That is, a undoped poly-Si region 160 may be formed at a side of a highly doped second conductivity type gate region 172, and a bottom of the highly doped second conductivity type gate region 172 may be formed to be adjoined to a second oxide layer 145. The highly doped second conductivity type gate region 172 extends from an upper surface of the undoped poly-Si region 160 to an upper surface of the oxide layer 145. A second conductivity type gate region 172 may be surrounded by a undoped poly-Si region 160 and a second oxide layer 145 and spaced from first and second doped poly-silicon regions 150a and 150b.

More specifically, a highly doped second conductivity type gate region 172 may be doped as a second conductivity type inside a undoped poly-Si region 160 of the conductive layer 100. A highly doped second conductivity type gate region 172 may be formed to be extended to an upper surface of an insulating film. Also, an area of a undoped poly-Si region 160 may be greater than an area of a highly doped second conductivity type gate region 172.

By forming a undoped poly-Si region 160 around a highly doped second conductivity type gate region 172, a problem of poly-silicon JFET operation may be solved, which is that pinch-off is not executed smoothly because of a leakage. That is, by forming a undoped poly-Si region 160, a leakage of a current flowing to first and second doped poly-silicon regions 150a and 150b may be prevented.

A substrate 110 may include an elemental semiconductor, a compound semiconductor, an alloy semiconductor, or a combination of them. An example of an elemental semiconductor may include silicon and germanium, but it is not limited thereto. An example of compound semiconductor may include SiC, SiGe, GaAs, and GaN, but it is not limited thereto.

A P-type doping substrate shown as a P-type substrate may be included. An example of a P-type dopant in a P-type doping substrate 110 may include boron, gallium and indium, but it is not limited thereto. About at least one embodiment, a substrate 110 may include a P-type doping silicon substrate.

A first conductivity type deep well region 120 may be a first conductivity type high voltage deep well region (HDNW). A first conductivity type deep well region 120 may be formed by implanting dopants of the first conductivity type to a substrate 110. First and second doped poly-silicon regions 150a and 150b with high resistance may be formed on a top surface of the first conductivity type deep well region 120.

An HDNW region 120 may be in an electrically floating state. Floating refers to a state that no voltage is applied. A higher withstand (breakdown) voltage may be ensured when the HDNW region 120 becomes a floating well. That is, a first conductivity type deep well region 120 may be floating. In some cases, HDNW (High voltage Deep N-type Well) may include a highly doped first conductivity type diffusion region (not shown). In a case of forming a highly doped first conductivity type diffusion region (not shown) in HDNW, a ground voltage is applied to the HDNW (GND).

A second conductivity type deep well region 130 may be located on opposite sides of a first conductivity type deep well region 120. A second conductivity type deep well region 130 may be formed by implanting dopants of the second conductivity type to a substrate 110. A second conductivity type deep well region 130 may be formed to be adjoined to a first conductivity type deep well region 120.

A first oxide layer 140 is a field insulating film, and it may be formed by LOCOS (LOCal Oxidation of Silicon) procedure or STI (Shallow Trench Isolation) procedure. In embodiments of the disclosure, a first oxide layer 140 formed by LOCOS (LOCal Oxidation of Silicon) procedure is described, but it is not limited thereto.

Thus, a highly doped second conductivity type doping region 174 may be formed on a surface of a first conductivity type deep well region 120. A highly doped second conductivity type doping region 174 may have a higher doping concentration than that of a second conductivity type deep well region 130.

A conductive layer 100 may include a drain region, a source region, and a gate region. A highly doped first conductivity type drain region 162 may form a drain region, and a highly doped a first conductivity type source region 164 may form a source region. A highly doped second conductivity type gate region 172 may form a gate region.

A highly doped second conductivity type gate region 172 may be located between the highly doped first conductivity type drain region and source regions 162 and 164. Hereupon, a source electrode and a drain electrode may be placed and spaced from each other, or even from a gate electrode.

Also, a highly doped second conductivity type gate region 172 may be located close to a highly doped a first conductivity type source region 164. Thus, a distance between a source electrode and a gate electrode may be shorter than a distance between a drain electrode and a gate electrode.

The conductive layer 100 may be a polycrystalline silicon (Poly-Si). A conductive layer 100 may include high resistance poly-silicon regions 150a and 150b doped with a low doping concentration.

A conductive layer 100 may comprise a undoped poly-Si region 160. A highly doped second conductivity type gate region 172 may become a gate and play a role to control a current flowing from a highly doped first conductivity type drain source 162, which becomes a drain, to a first conductivity source region 164, which becomes a source.

The highly doped second conductivity type gate region 172 may be doped as a cross-section, crossing to a bottom of a conductive layer 100. Contact plugs and metal wirings may be formed on the first conductivity type drain and source regions 164, and a highly doped second conductivity type gate region 172. Herein, a conductive layer 100 may become a poly resistance of a first conductivity type, and when its length is increased, as a structure similar to a resistance, it becomes a semiconductor device including a poly-silicon junction field-effect transistor of high withstand voltage (poly-silicon JFET).

With reference to FIG. 2B, except adding a non-sal layer and a silicide film, other elements are the same with FIG. 2A.

A partial area of a conductive layer 100 does not form a silicide film to maintain a high resistance. Instead, a highly doped first conductivity type drain region 162, a highly doped a first conductivity type source region 164, and a highly doped second conductivity type gate region 172 form a silicide film 230 to lower contact resistance. A non-sal layer 250 may be additionally formed to prevent a silicide film 230 from forming. A non-sal layer 250 may be called a silicide blocking film, and it may be formed with SiO2, SiON, SiN, etc. A silicide film 230 may be formed with TiSi2, CoSi2, NiSi, PtSi, etc. A silicide film 230 may be formed not only in A highly doped second conductivity type gate region 172, but formed to be extended to a undoped poly-Si region 160. Or a silicide film 230 may not be formed in a undoped poly-Si region 160 to diminish a leakage current. In this case, a non-sal layer 250 or a silicide blocking film 250 is formed to cover a undoped poly-Si region 160.

Figure 3:
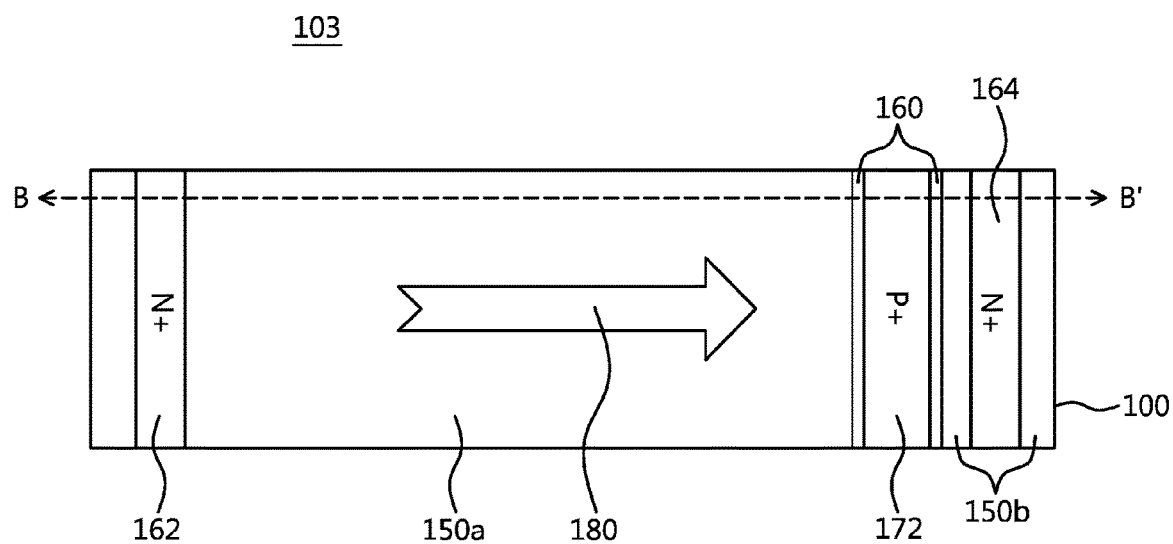
FIG. 3 illustrates a view of a semiconductor device including a poly-silicon junction field-effect transistor, according to another one or more embodiments of the disclosure.

FIG. 3 illustrates a view of a semiconductor device including a poly-silicon junction field-effect transistor according to another one or more embodiments of the disclosure.

With reference to FIG. 3, a semiconductor device 103 including poly-silicon junction field-effect transistor according to another one or more embodiments of the disclosure may comprise a highly doped first conductivity type drain region 162, a highly doped a first conductivity type source region 164 formed in a conductive layer 100, and a single second conductivity type gate region 172. Unlike FIG. 1, a structure of poly-silicon JFET of FIG. 3 has only one second conductivity type gate region 172.

A highly doped second conductivity type gate region 172 is located between a highly doped first conductivity type drain region 162 and a highly doped a first conductivity type source region 164, and it is disposed closer to the first conductivity type source region 164. And, a undoped poly-Si region 160 may be formed around a highly doped second conductivity type gate region 172. A current between a drain-source region may be designed to flow under a highly doped second conductivity type gate region 172 (refer to a cross-sectional view of FIG. 4). That is, another doped poly-silicon region 150c may also exist under a highly doped second conductivity type gate region 172.

A highly doped second conductivity type gate region 172 may exist inside a undoped poly-Si region 160. A third doped poly-silicon region 150c may exist under the highly doped second conductivity type gate region 172. Therefore, a current may flow toward a source when a bias is applied to a drain through the third doped poly-silicon region 150c, which exists under a highly doped second conductivity type gate region 172.

Figure 4A:
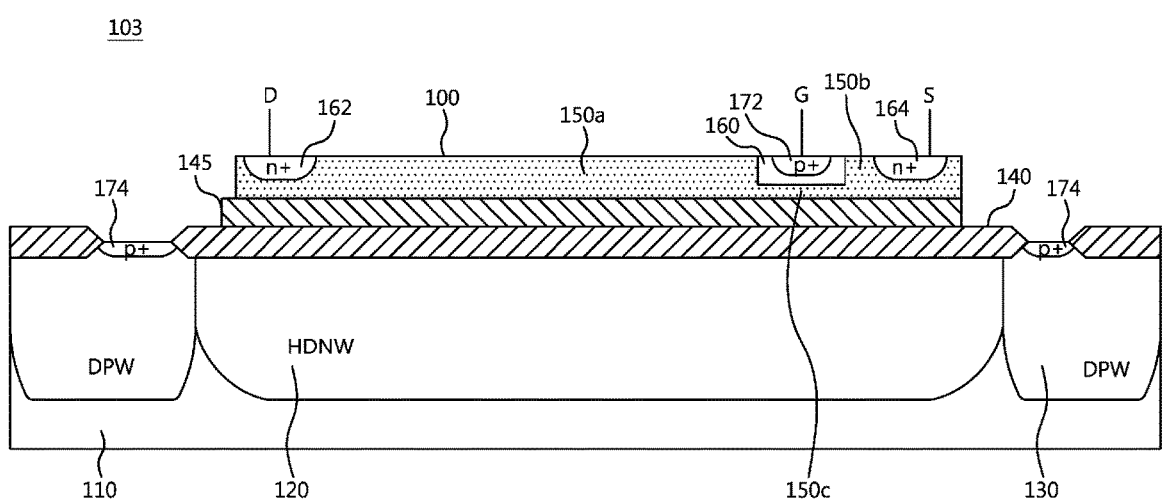
FIGS. 4A and 4B are cross-sectional views of a semiconductor device, including poly-silicon junction field-effect transistor according to B-B' of FIG. 3.
Figure 4B:
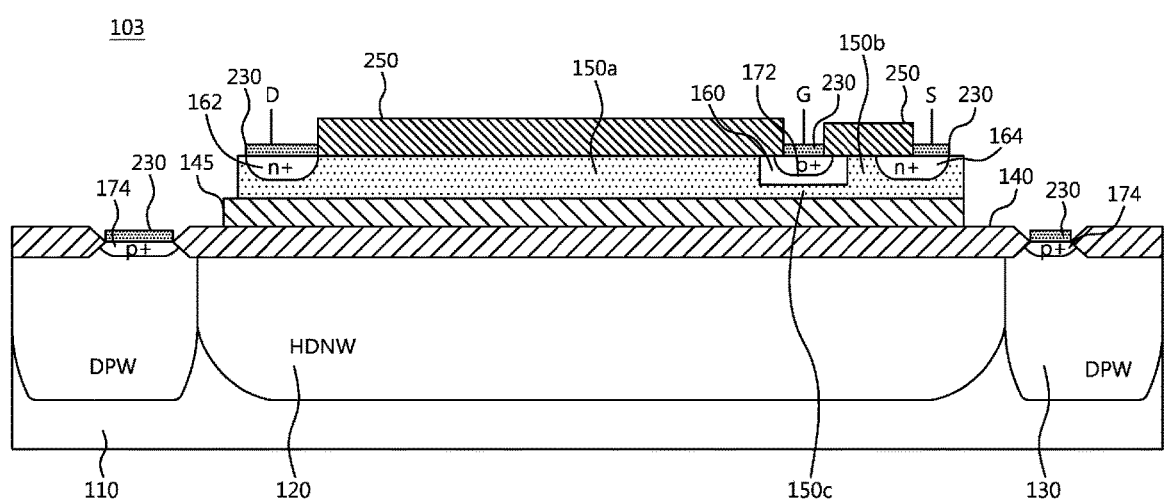

FIGS. 4A and 4B are cross-sectional views of a semiconductor device, including poly-silicon junction field-effect transistor according to B-B' of FIG. 3.

A structure of a semiconductor device 103 in FIG. 4A is similar to a structure of a semiconductor device 102 in FIG. 2A, so the same contents may be abridged. A semiconductor device 103 including poly-silicon junction field-effect transistor according to another one or more embodiments may be formed by a undoped poly-Si region 160 surrounding a highly doped second conductivity type gate region 172 completely. A undoped poly-Si region 160 may be formed between the first and second doped poly-silicon regions 150a and 150b. A highly doped second conductivity type gate region 172 is surrounded by the undoped poly-Si region 160. So the highly doped second conductivity type gate region 172 may be spaced from first and second doped poly-silicon regions 150a and 150b by the undoped poly-Si region 160.

Moreover, a third doped poly-silicon region 150c may be disposed under a undoped poly-Si region 160. The third doped poly-silicon region 150c may become a current path. By forming a conductive layer 100 under a highly doped second conductivity type gate region 172, a current may flow under the highly doped second conductivity type gate region 172.

The third doped poly-silicon region 150c may be disposed between a undoped poly-Si region 160 and a second oxide layer 145. Therefore, a undoped poly-Si region 160 is separately formed from a second oxide layer 145 by the third doped poly-silicon region 150c. In this case, a highly doped second conductivity type gate region 172 may be formed shallower than a highly doped first conductivity type drain region 162 and a highly doped a first conductivity type source region 164.

With reference to FIG. 4B, except adding a non-sal layer and a silicide film, other elements are the same with FIG. 4A. Also, about a non-sal layer 250 and a silicide film 230, the same description of FIG. 2B is applied.

Figure 5:
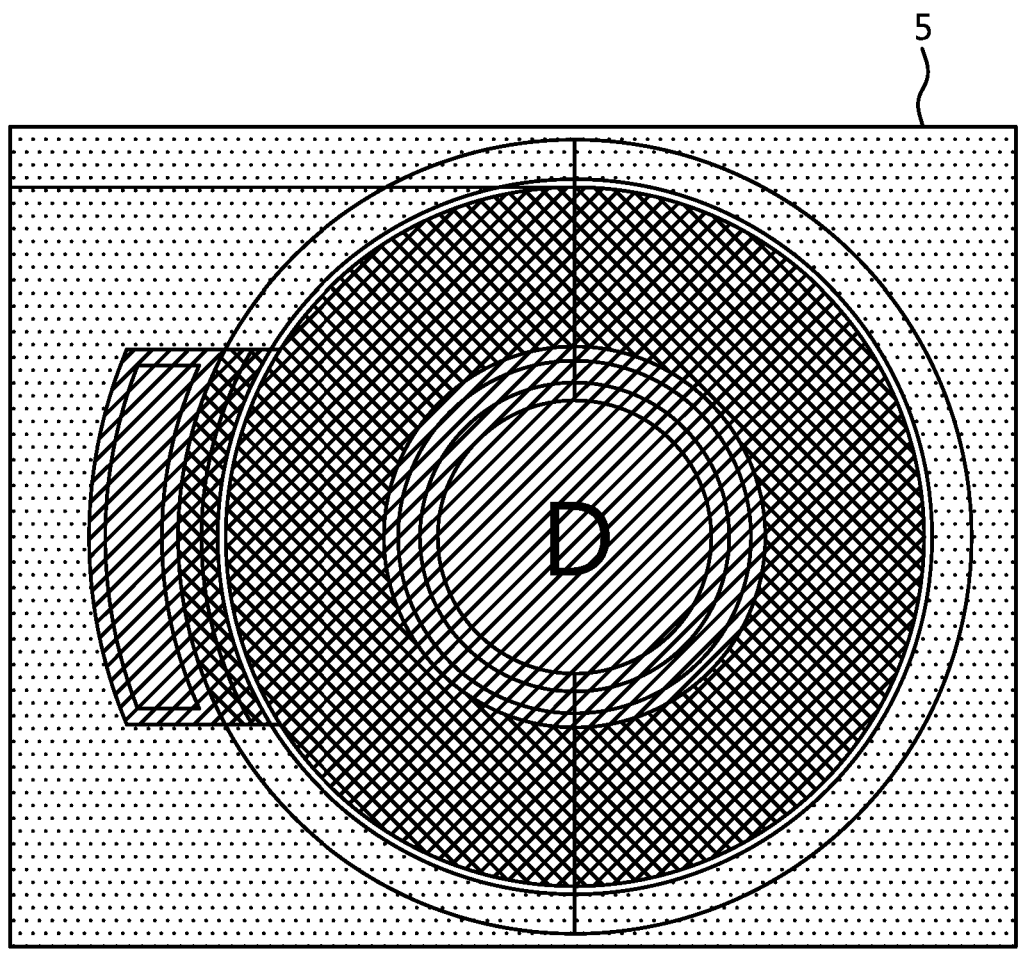
FIG. 5 is a layout of a substrate-based junction field-effect transistor.
Figure 6:
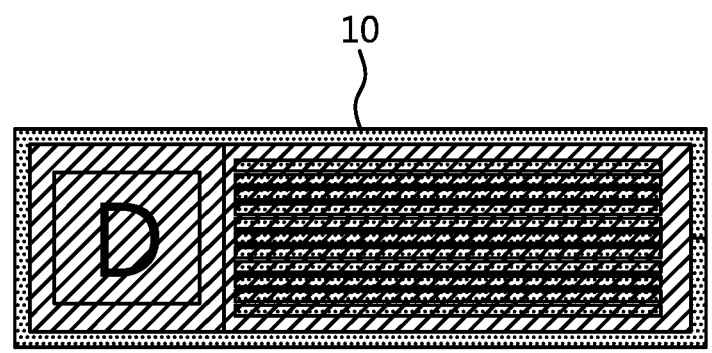
FIG. 6 is a layout drawing of a poly-silicon junction field-effect transistor, according to one or more embodiments of the disclosure.

FIG. 5 is a layout drawing of a substrate-based junction field-effect transistor, and FIG. 6 is a layout drawing of a semiconductor device including poly-silicon junction field-effect transistor according to one or more embodiments of the disclosure.

FIG. 5 is a substrate-based junction field-effect transistor (JFET, 5), which is not a junction field-effect transistor using poly-silicon. A substrate-based junction field-effect transistor (JFET, 5) is a JFET device formed by properly implanting N-type and P-type dopants on a substrate. FIG. 5 draws a layout of junction field-effect transistor 5 that has about 700V withstand voltage.

On the other hand, FIG. 6 is a poly-silicon junction field-effect transistor (Poly-Si JFET, 10) formed on a substrate using a poly-silicon. FIG. 6 is for comparing with FIG. 5, and it is a layout of a poly-silicon junction field-effect transistor 10 that has a 700V withstand voltage. Compared with a layout of substrate-based junction field-effect transistor 5, an entire area of a poly-silicon junction field-effect transistor 10, according to one or more embodiments of the disclosure, is much smaller.

With reference to FIG. 6, a layout of a poly-silicon junction field-effect transistor 10 according to one or more embodiments of the disclosure may be designed in accordance with an operating voltage, by controlling a length of a poly-silicon with high resistance. A poly-silicon junction field-effect transistor 10 may ensure the same withstand voltage feature with a substrate-based junction field-effect transistor, by placing a plurality of poly-silicon with high resistance in a row.

A poly-silicon junction field-effect transistor 10 may show the same voltage feature with a 20% smaller area than a layout of a substrate-based junction field-effect transistor 5. Through that, a size of a chip may be reduced, and an excellent outcome may be ensured in terms of cost.

Figure 7:
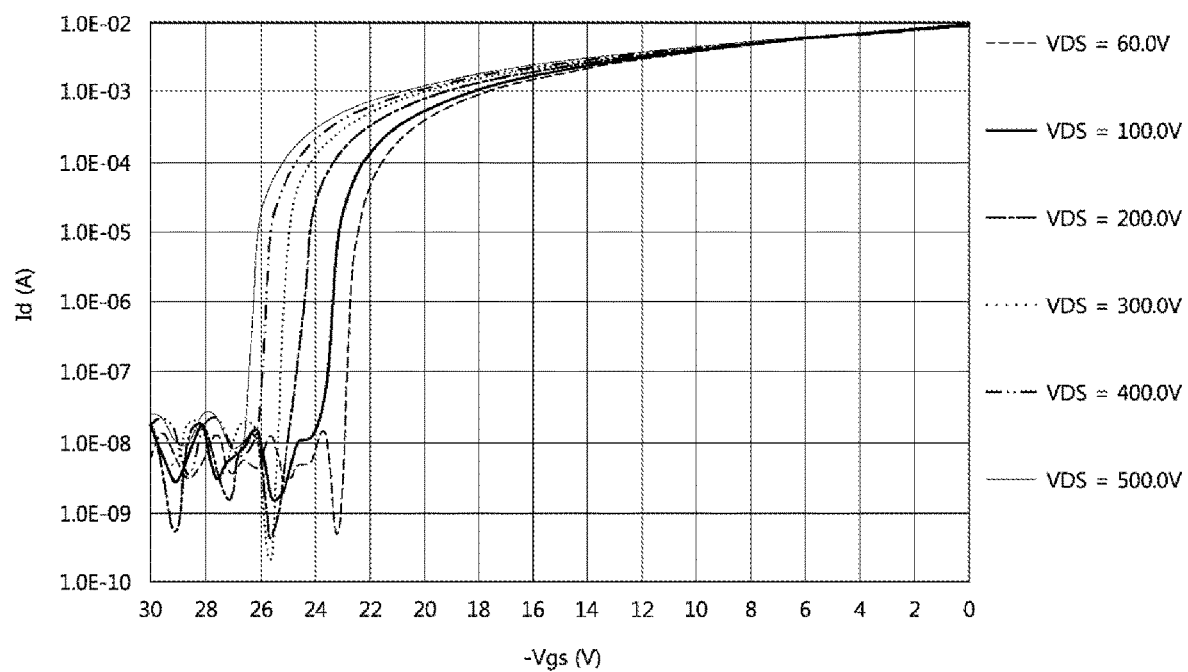
FIG. 7 is a graph of the pinch-off of a substrate-based junction field-effect transistor.
Figure 8:
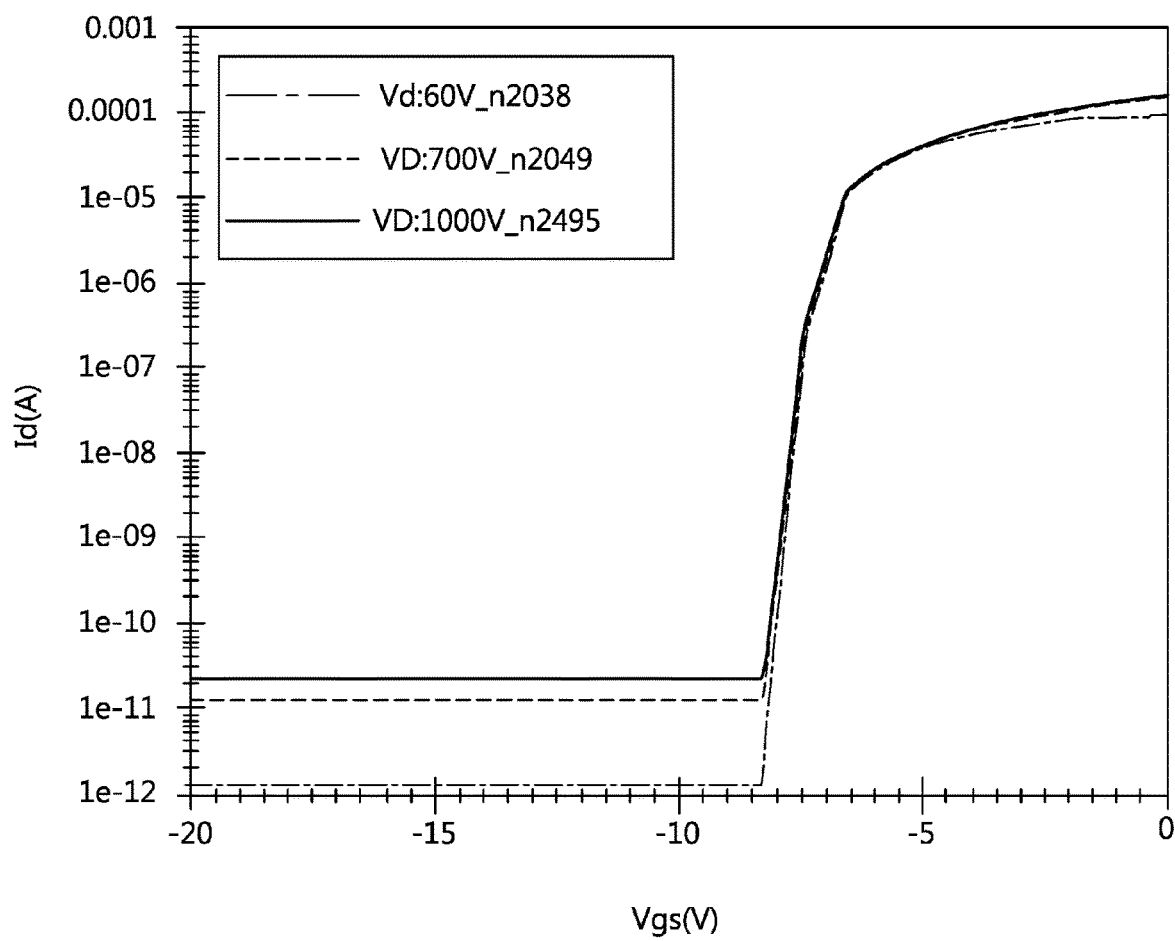
FIG. 8 is a graph of the pinch-off of a poly-silicon junction field-effect transistor, according to one or more embodiments of the disclosure.

FIG. 7 is a graph of pinch-off of a substrate-based junction field-effect transistor which is shown in FIG. 5. and FIG. 8 is a graph of pinch-off of a poly-silicon junction field-effect transistor which is shown in FIG. 6 according to one or more embodiments of the disclosure.

In FIG. 7 and FIG. 8, the x-axis is a gate bias, and the y-axis is a drain current.

With reference to FIG. 7, in a substrate-based junction field-effect transistor 5, pinch-off changes according to an increase of a drain bias. That is, in a substrate-based junction field-effect transistor (JFET, 5), a pinch-off voltage changes because a depletion area is affected according to an increase of a drain bias.

With reference to FIG. 8, in a poly-silicon junction field-effect transistor (Poly-Si JFET, 10), there is no change of a drain bias, but it is steady because a structure is composed of poly-silicon, not a junction structure. Thus, a poly-silicon junction field-effect transistor 10 may have a steady pinch-off feature regardless of a drain bias, and it is possible to provide a stable current in the case of designing a circuit.

FIGS. 9A to 9D illustrate a process order of manufacturing method of a semiconductor device including poly-silicon junction field-effect transistor according to one or more embodiments of the disclosure.

In FIGS. 9A to 9D, an N-type is shown as a first conductivity type, and a P-type is shown as a second conductivity type, but the opposite may be embodied, as described above.

Figure 9A:
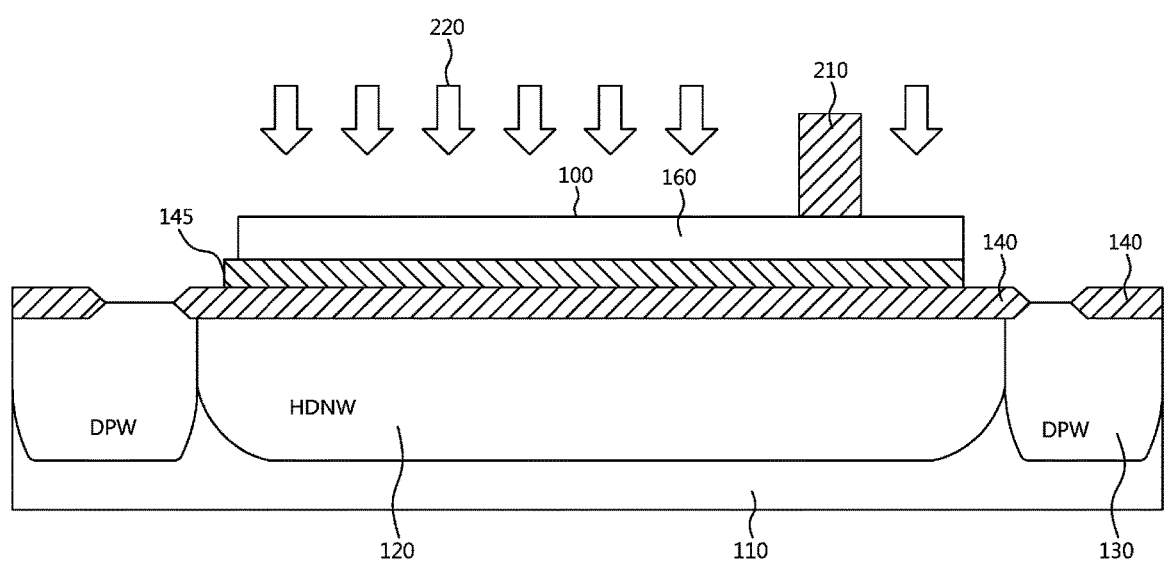
FIGS. 9A to 9D illustrate a process order of manufacturing method of a semiconductor device, including poly-silicon junction field-effect transistor, according to one or more embodiments of the disclosure.

With reference to FIG. 9A, a semiconductor device, including poly-silicon junction field-effect transistor, may form an insulating film that includes a first oxide layer 140 and a second oxide layer 145 on a substrate 110. A first conductivity type deep well region 120 and a second conductivity type deep well region 130 may be formed in a substrate 110. Herein, a second conductivity type deep well region 130 may be formed on opposite sides of a first conductivity type deep well region 120. A second conductivity type deep well region 130 on opposite sides of a first conductivity type deep well region 120 may be formed to be adjoined to each other.

A first oxide layer 140 may be formed on a first conductivity type deep well region 120 and a second conductivity type deep well region 130. A first oxide layer 140 may be formed on the entire top surface of a first conductivity type deep well region 120 and formed on a part of the top surface of a second conductivity type deep well region 130. Through that, a part of a second conductivity type deep well region 130 may be exposed.

A second oxide layer 145 may be formed in the first oxide layer 140 to ensure a higher withstand voltage. A second oxide layer 145 is optional. The thickness of the first oxide layer 140 and the second oxide layer 145 may differ. If enough withstand voltage is ensured with a first oxide layer 140, a first oxide layer 140 may be formed only. A vertical withstand voltage may be further ensured by adding a second oxide layer 145 between a conductive layer 100 and a first oxide layer 140. The second oxide layer 145 may be omitted when a vertical withstand voltage is enough for a design condition.

A conductive layer 100 may be deposited on a first oxide layer 140 or a second oxide layer 145. For example, a conductive layer 100 may be deposited by a poly-silicon layer comprising a poly-crystal silicon (Poly-Si) through the LPCVD method. Because a deposited poly-silicon layer is not doped, it may be considered as a undoped poly-Si region 160.

A part of a conductive layer 100 may be covered by a photoresist (PR) pattern 210. That is, a part of a undoped poly-Si region 160 may be covered by a photoresist (PR) pattern 210. And towards a undoped poly-Si region 160, ion may be implanted 220 as a first conductivity type(N-type) using a proper ion implantation energy. For example, an ion may be implanted with 1E13-1E14/cm2 dose.

Figure 9B:
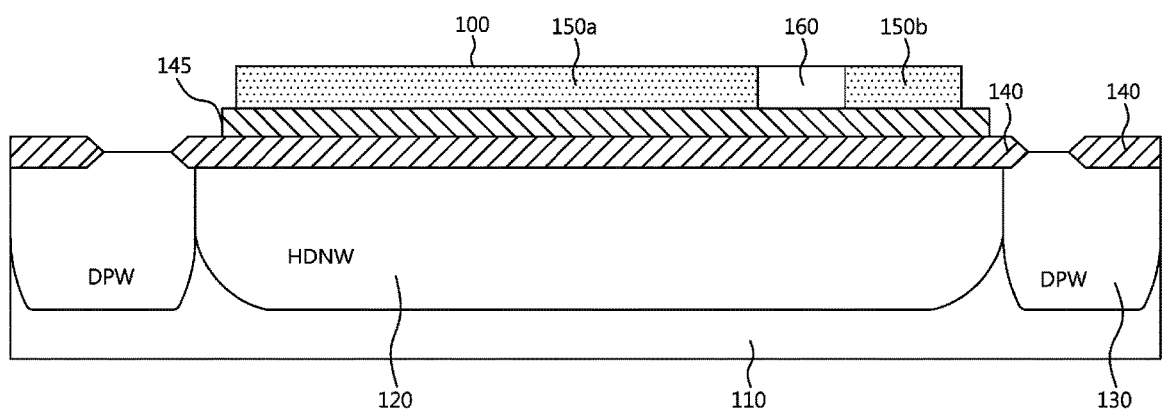

With reference to FIG. 9B, first and second doped poly-silicon regions 150a and 150b are formed in the conductive layer 100 by the above-described ion implantation. An area masked with PR pattern may remain as a undoped poly-Si region 160. Thus, a conductive layer 100 may include first and second doped poly-silicon regions 150a and 150b, and a undoped poly-Si region 160.

Figure 9C:
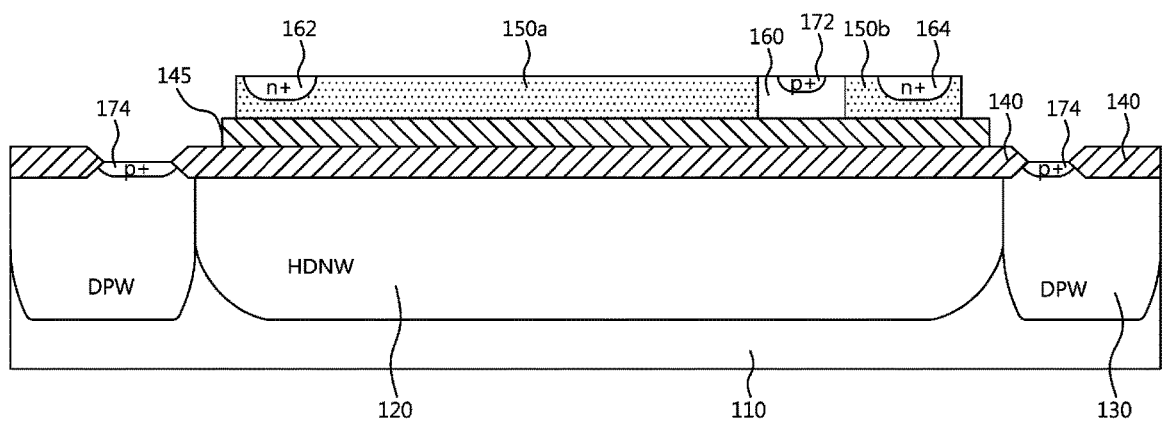

With reference to FIG. 9C, the highly doped first conductivity type drain and source regions 162 and 164 doped with a high concentration, may be formed in first and second doped poly-silicon regions 150a and 150b, respectively. For example, ion may be implanted by Arsenic (As) or Phosphorous (P) with a 1E15-1E16/cm2 dose.

And, a highly doped second conductivity type gate region 172 may be formed in a undoped poly-Si region 160. For example, ion may be implanted by Boron (B) or Boron fluoride (BF2) with 1E15-1E16/cm2 dose. Therefore, a structure may be made where a undoped poly-Si region 160 surrounds a side or a bottom of A highly doped second conductivity type gate region 172.

The highly doped first conductivity type drain and source regions 162 and 164 correspond to a drain and a source, respectively, and a highly doped second conductivity type gate region 172 corresponds to a gate. In a highly doped second conductivity type gate region 172, a current flow may be controlled between the highly doped first conductivity type drain and source regions 162 and 164.

And, in a part where the second conductivity type deep well region 130 is exposed, a highly doped second conductivity type doping region 174 may be formed through doping as a second conductivity type.

Figure 9D:
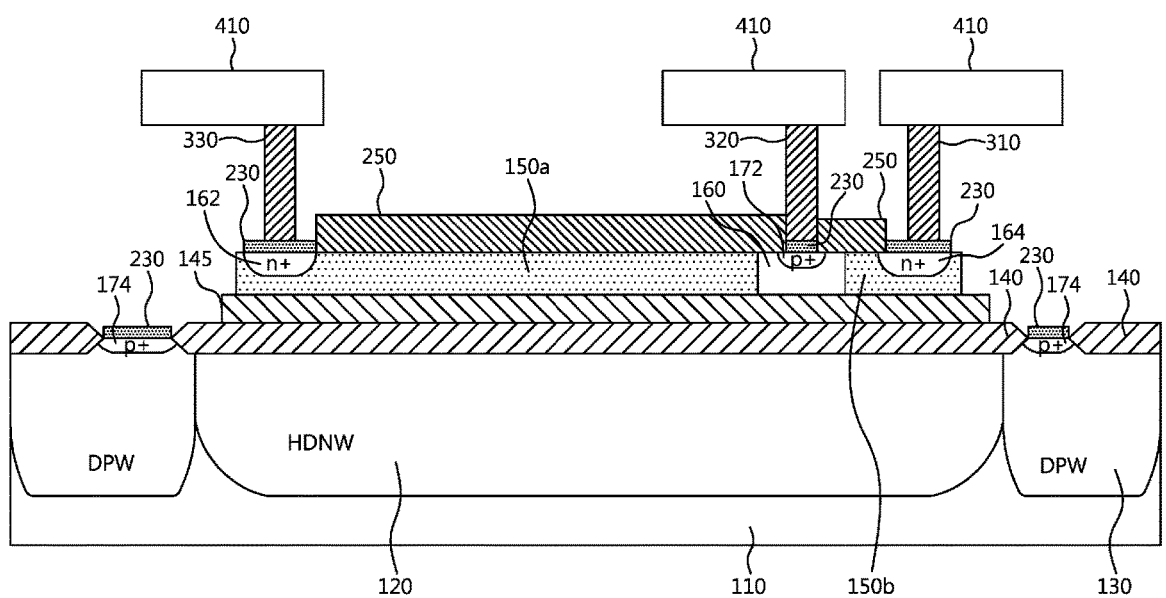

With reference to FIG. 9D, a partial region of a conductive layer 100, does not form a silicide film 230 to maintain a high resistance. Instead, a highly doped first conductivity type drain region 162, a highly doped a first conductivity type source region 164, and a highly doped second conductivity type gate region 172 form a silicide film 230 to lower a contact resistance. Other region may additionally form a non-sal layer 250 to prevent a silicide film 230 from forming. A non-sal layer 250 may be called as a silicide blocking film, and it may be formed with SiO2, SiON, SiN etc. A silicide film 230 may be formed with TiSi2, CoSi2, NiSi, PtSi, etc. A silicide film 230 may be formed not only in a highly doped second conductivity type gate region 172, but formed to be extended to a undoped poly-Si region 160. Or a silicide film 230 may not be formed in a undoped poly-Si region 160 to diminish a leakage current. In this case, a non-sal layer 250 or a silicide blocking film 250 may be formed to cover a undoped poly-Si region 160.

A source contact plug 310, a gate contact plug 320, and a drain contact plug 330 may be respectively formed in a highly doped a first conductivity type source region 164, a highly doped second conductivity type gate region 172, and a highly doped first conductivity type drain region 162. After forming a plurality of contact plugs 310, 320, 330, a metal wiring 410 may be formed. Through that, a poly-silicon junction field-effect transistor 10 is formed.

Figure 10:
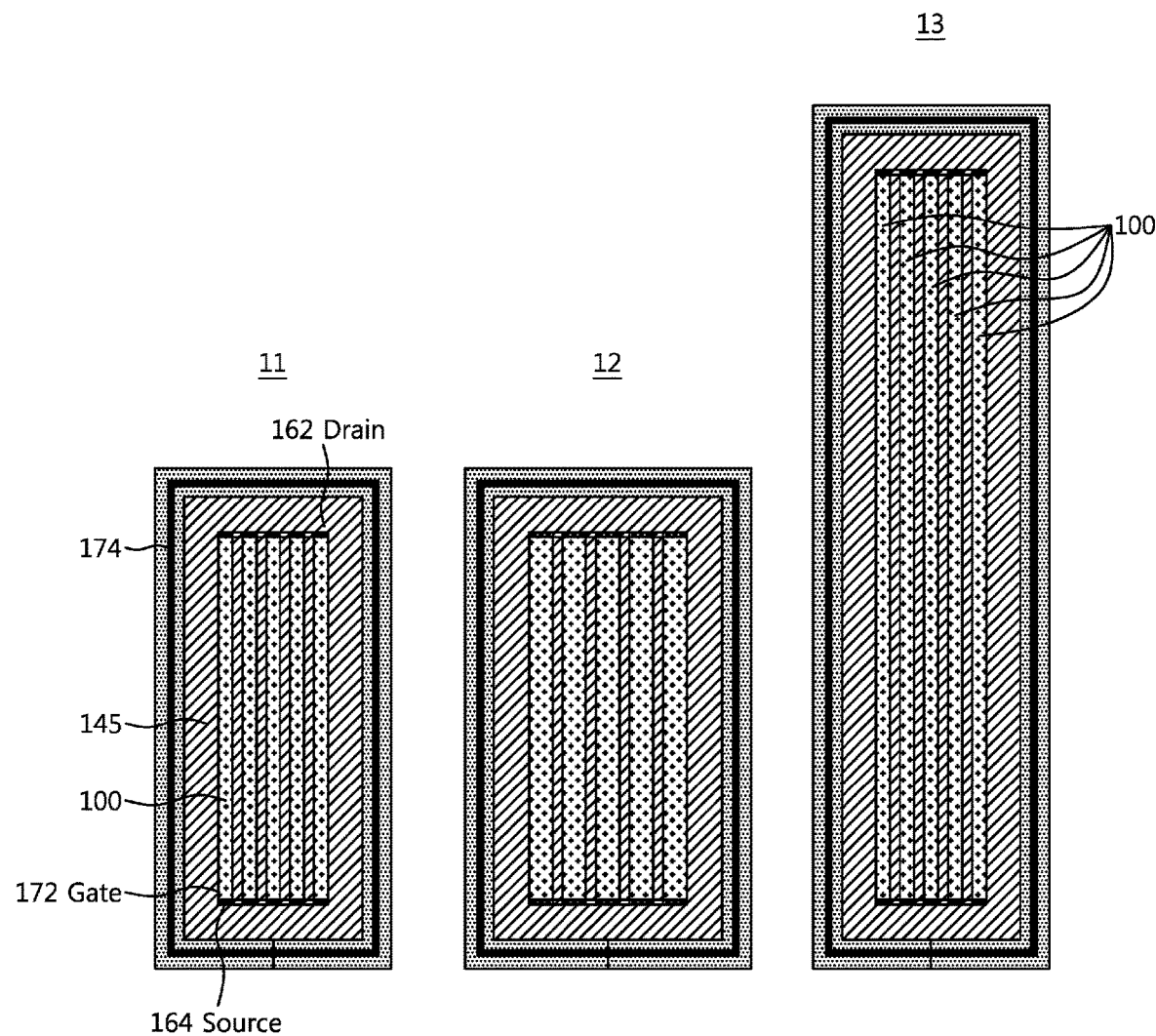
FIG. 10 is a layout of a semiconductor device, including a poly-silicon junction field-effect transistor, according to one or more embodiments of the disclosure.

FIG. 10 is a semiconductor device layout including a poly-silicon junction field-effect transistor according to one or more embodiments of the disclosure.

With reference to FIG. 10, a first, second, third poly-silicon JFET 11, 12, 13 with different lengths and widths are shown. Each of the first, second, third poly-silicon JFET 11, 12, 13 may be placed with a predetermined distance and in parallel alongside five conductive layers 100. Herein, a conductive layer 100 indicates a poly-silicon layer. A number of a conductive layer 100 may not be five, and it may vary depending on needs. Each of the conductive layer 100 may have a predetermined length and width. Thus, by adjusting a predetermined length and width of a conductive layer 100, a withstand voltage of a poly-silicon JFET 11 to 13 may be controlled. An area of a poly-silicon JFET 11, 12, 13 may be changed according to width and length. For example, compared with the first poly-silicon JFET 11, a second poly-silicon JFET 12 may have the same length of a conductive layer 100 but a greater width. Therefore, a second poly-silicon JFET 12 may have a greater area and a higher withstand voltage than a first poly-silicon JFET 11. Likewise, a third poly-silicon JFET 13 may have the same width but a longer length than a first poly-silicon JFET 11. Thus, a third poly-silicon JFET 13 may have a higher withstand voltage than a first poly-silicon JFET 11.

In a top view, a conductive layer 100 is surrounded by a highly doped second conductivity type doping region 174, and it is also surrounded by a second oxide layer 145. In a poly-silicon JFET, five conductive layers 100 may be placed in parallel and alongside each other. Each conductive layer 100 has a one end and the other end. A source region 164 of a first conductivity type may be formed in a one end of a conductive layer 100. A highly doped first conductivity type drain region 162 may be formed in the other end of a conductive layer 100.

Figure 11:
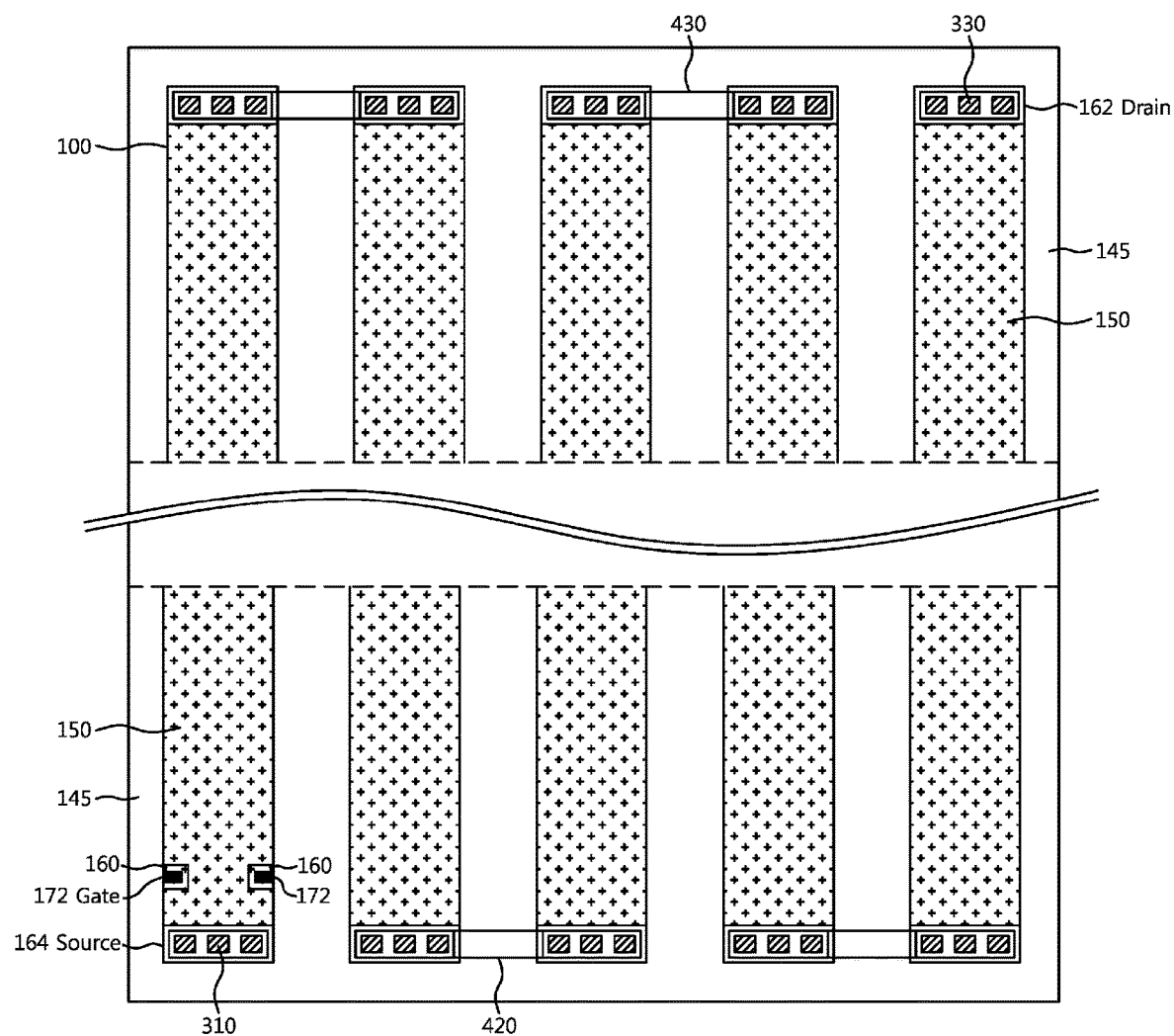
FIG. 11 is an expanded drawing of poly-silicon JFET according to one or more embodiments of the disclosure of FIG. 10.

FIG. 11 is an expanded illustration of poly-silicon JFET according to one or more embodiments of the disclosure.

With reference to FIG. 11, in a poly-silicon JFET, according to one or more embodiments of the disclosure, at least five doped poly-silicon regions 150 may be placed in parallel and alongside each other. Each of the doped poly-silicon regions 150 has one end and the other end. A source contact plug 310 may be formed in one end of the doped poly-silicon regions 150, and a drain contact plug 330 may be formed in the other end of the doped poly-silicon regions 150. A source region 164 of a first conductivity type may be formed under a source contact plug 310. Likewise, a highly doped first conductivity type drain region 162 may be formed under a drain contact plug 330. Moreover, a plurality of metal wirings 420, 430 may be formed to connect another contact plugs to each other.

Figure 12:
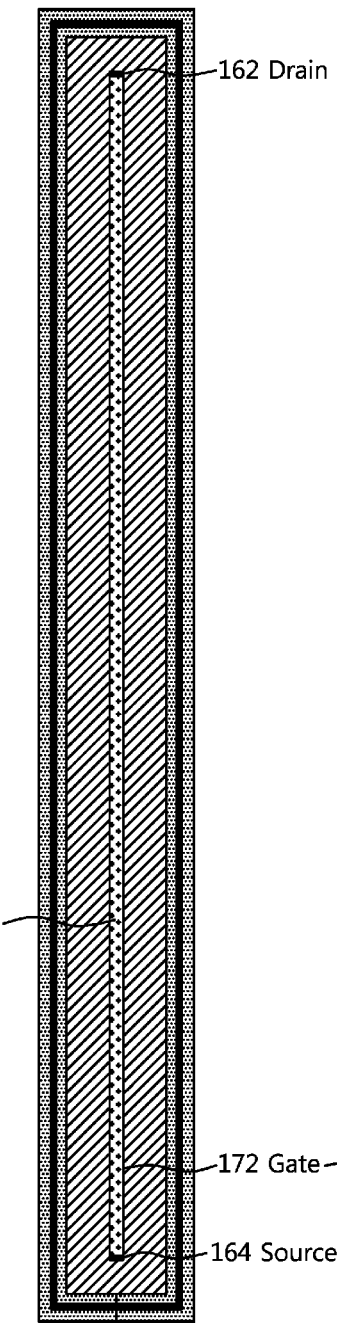
FIG. 12 is a poly-silicon JFET drawing according to one or more embodiments, which has the same area.
Figure 12:
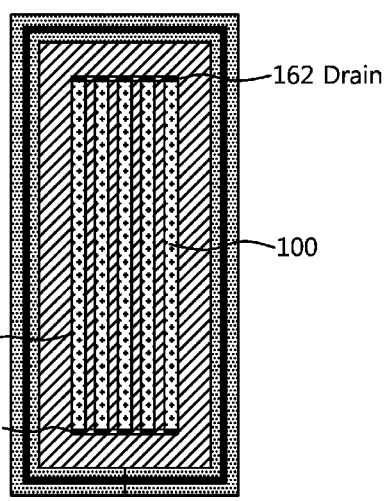

FIG. 12 is a poly-silicon JFET drawing according to one or more embodiments, which has the same area.

With reference to FIG. 12, a fourth poly-silicon JFET 14 may be formed as a long-formed conductive layer 100. Herein, a conductive layer 100 indicates a poly-silicon layer. A fifth poly-silicon JFET 15 may be formed as five conductive layers 100 to have the same area as a fourth poly-silicon JFET 14, though it may have a short length. Therefore, according to a size of a chip, a poly-silicon JFET 14, 15 may be properly formed, embodying a JFET structure with a high withstand voltage.

According to the disclosure, by merely increasing a length, a semiconductor device including poly-silicon junction field-effect transistor (Poly-Silicon JFET) with various withstand voltage may be embodied, and size may also be diminished. Therefore, a process may be simplified, and a cost may be reduced.

Also, regardless of drain bias, it may always have a steady pinch-off feature, making it possible to provide stable current when designing a circuit.

As described above, with a semiconductor device including poly-silicon junction field-effect transistor according to various embodiments of the disclosure, it is easy to control a gate because a pinch-off voltage is steadily maintained, and it is beneficial in terms of cost because it is possible to control a length of a poly-silicon, and a micronization of device size is possible.

While this disclosure includes specific examples, it will be apparent after an understanding of the disclosure of this application that various varies in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A semiconductor device, comprising:
an insulating film formed on a substrate;
a single poly-silicon layer comprising an undoped poly-silicon region, first and second doped poly-silicon regions and formed on the insulating film;
a highly doped first conductivity type drain and source regions formed in the first and second doped poly-silicon regions, respectively; and
a highly doped second conductivity type gate region formed in the single poly-silicon layer disposed between the highly doped first conductivity type drain and source regions,
wherein the highly doped first conductivity type drain and source regions, and the highly doped second conductivity type gate region are each formed above the insulating film, and
wherein the undoped poly-silicon region is disposed closer to the highly doped first conductivity type source region than the highly doped first conductivity type drain region.

2. The semiconductor device of claim 1, further comprising:
a first conductivity type deep well region formed in the substrate to overlap the single poly-silicon layer,
wherein the first conductivity type deep well region is in a floating state.

3. The semiconductor device of claim 1, wherein the insulating film comprises a first oxide layer and a second oxide layer with different thicknesses.

4. The semiconductor device of claim 1, wherein an area of the undoped poly-silicon region is larger than an area of the highly doped second conductivity type gate region.

5. The semiconductor device of claim 1, wherein the highly doped second conductivity type gate region extends to an upper surface of the insulating film.

6. The semiconductor device of claim 1, wherein the semiconductor device is a poly-silicon junction field-effect transistor (poly-silicon JFET).

7. The semiconductor device of claim 6, wherein the poly-silicon JFET comprises a plurality of conductive layers, each of which is rectangular in shape, spaced apart and arranged in parallel.

8. The semiconductor device of claim 1, wherein the highly doped second conductivity type gate region is disposed closer to the highly doped first conductivity type source region than the highly doped first conductivity type drain region.

9. The semiconductor device of claim 1, further comprising:
- a silicide film formed on the highly doped second conductivity type gate region; and
- a non-sal layer formed on the conductive single poly-silicon layer.

10. A semiconductor device, comprising:
- an oxide layer disposed on a substrate;
- a single poly-silicon layer comprising first and second doped poly-silicon regions and a undoped poly-silicon region and disposed on the oxide layer;
- a highly doped first conductivity type drain and source regions disposed in the first and second doped poly-silicon regions, respectively;
- a highly doped second conductivity type gate region formed in the single poly-silicon layer disposed between the highly doped first conductivity type drain and source regions,
- wherein the highly doped first conductivity type drain and source regions, and the highly doped second conductivity type gate region are each formed above the insulating film; and
- a first non-sal layer disposed on the single poly-silicon layer over a portion of the highly doped first conductivity type drain region and a portion of the highly doped second conductivity type gate region.

11. The semiconductor device of claim 10, further comprising a second non-sal layer disposed on the single poly-silicon layer over a portion of the undoped poly-silicon region and another portion of the highly doped second conductivity type gate region.

12. The semiconductor device of claim 10, wherein the highly doped second conductivity type gate region is disposed closer to the highly doped first conductivity type source region than the highly doped first conductivity type drain region.

13. The semiconductor device of claim 11, wherein the highly doped second conductivity type gate region extends from an upper surface of the undoped poly-silicon region to an upper surface of the oxide layer.

14. The semiconductor device of claim 11, further comprising another oxide layer disposed between the oxide layer and the substrate.

15. The semiconductor device of claim 11, wherein the semiconductor device is a poly-silicon junction field-effect transistor (poly-silicon JFET).

16. The semiconductor device of claim 1, wherein the highly doped first conductivity type source and drain regions and the highly doped second conductivity type gate region are formed in the single poly-silicon layer.

17. The semiconductor device of claim 10, wherein the highly doped first conductivity type source and drain regions and the highly doped second conductivity type gate region are formed in the single poly-silicon layer.

* * * * *